United States Patent [19]

Meusburger

[11] 4,272,693
[45] Jun. 9, 1981

[54] ANALYSIS CIRCUIT FOR A CHARGE COUPLED DEVICE

[75] Inventor: Güenther Meusburger, Munich, Fed. Rep. of Germany

[73] Assignee: Siemens Aktiengesellschaft, Berlin & Munich, Fed. Rep. of Germany

[21] Appl. No.: 71,539

[22] Filed: Aug. 31, 1979

Related U.S. Application Data

[63] Continuation of Ser. No. 896,754, Apr. 17, 1978.

[30] Foreign Application Priority Data

May 31, 1977 [DE] Fed. Rep. of Germany ....... 2721812

[51] Int. Cl.³ .................... H03K 3/353; G11C 19/28; H01L 29/78
[52] U.S. Cl. .............................. 307/304; 307/221 D; 357/24
[58] Field of Search .............. 357/24; 307/221 D, 304

[56] References Cited

U.S. PATENT DOCUMENTS 3,623,132  11/1971  Green .................................... 357/24
4,048,519  9/1977  Hoffman et al. ....................... 357/24

OTHER PUBLICATIONS

MacLennan "Charge-Coupled Devices: 3-Signal Processing", Wireless World (2/75) pp. 61-65.
Kosonocky "Charge-Coupled Devices—An Overview", Wescon Technical Papers, vol. 18 (1974), session 2/1, pp. 1-20.

*Primary Examiner*—Gene M. Munson
*Attorney, Agent, or Firm*—Hill, Van Santen, Steadman, Chiara & Simpson

[57] ABSTRACT

A CCD arrangement which includes a semiconductor layer of a first conductivity type, a layer of insulating material on the semiconductor layer, a row of shift electrodes on the insulating layer. The row of shift electrodes on the insulating layer are fed with pulse train voltages displaced in phase relative to one another. The charges are fed to an output end diffusion zone of the opposite conductivity type which has previously been brought to a reference potential and then released from the latter producing a state which is not bound in potential to the exterior. One of the shift electrodes is connected via a terminal to a transistor switch which intermittently supplies the assigned pulse train voltage, and to the gate of a field effect capacitor whose counter electrode is fed with a periodic pulse voltage. The rising flanks of this pulse voltage are each delayed relative to the times at which the assigned pulse train voltage is interrupted. The terminal of the aforesaid one shift electrode is connected to the gate of a field effect capacitor which serves as a signal output.

5 Claims, 6 Drawing Figures

4,272,693

ANALYSIS CIRCUIT FOR A CHARGE COUPLED DEVICE

This is a continuation of application Ser. No. 896,754, filed Apr. 17, 1978.

BACKGROUND OF THE INVENTION

This invention relates to a CCD arrangement which includes a semiconductor layer of a first conductivity type having a layer of insulating material such as silicon dioxide on one surface of the semiconductor layer, and a row of shift electrodes on the insulating layer which are fed with pulse train voltages displaced in phase relative to one another.

CCDs of this type have been described in detail, for example, Kosonocky in the "WESCON Technical Papers", Vol. 18, 1974, Session 2/1, pages 1–20 under the title "Charge-Coupled Devices—An Overview". They operate in such a manner that a plurality of electric charges which each correspond in size to sampled instantaneous values of an input signal and are equidistant to one another in respect of time and space, are displaced in stepped fashion along the row of electrodes in the direction towards the output of the arrangement under the influence of phase displaced pulse train voltages which are supplied to the shift electrodes. At the output of the arrangement, they are then evaluated consecutively in respect of time and used to form corresponding output signals. If one is concerned with processing analogue input signals, the sizes of the individual charges each correspond to a whole series of different instantaneous values of the input signal, whereas when digital input signals are being processed only two different logic states, "1" or "0" are represented by the presence or absence of a specific charge. In arrangements of this kind, the input signal can also consist of a radiation which falls into the substrate where it produces a formation of charge carrier pairs which differs in intensity in accordance with its own intensity. A CCD employed in this way is also referred to as an image sensor.

The evaluation, to be carried out at the output of a CCD, of the charges displaced in the semiconductor layer gives rise to difficulties, however, inasmuch as these are very small charges. In accordance with FIG. 10 (b) of the above mentioned publication, the charges are fed, for example, to an output-end diffusion zone of opposite conductivity which is previously brought to a reference potential and then released from the latter producing a state which is not bound in potential to the exterior (floating state). On the recharging of the pn-capacitance of the output-end diffusion zone and of the gate capacitance of a following read-out transistor by a charge displaced into the diffusion zone, from the read-out transistor, it is then possible to tap an output signal which exhibits only a very small voltage range produced by the recharging.

SUMMARY OF THE INVENTION

The object of the present invention is to provide an analysis circuit of the type described above, which supplies an output signal exhibiting considerably greater voltage changes as a function of the difference in size between the individual, displaced charges.

This is achieved in accordance with the invention by the measures described in the characterizing part of Patent claim 1.

The advantage which can be achieved with the invention consists in particular in that even small differences in charge produce voltage changes in the output signal which are such that an extremely accurate and adequately linear amplification of the signal to be transmitted via the CCD takes place.

BRIEF DESCRIPTION OF THE DRAWINGS

The invention will be explained in detail in the following, making reference to a preferred exemplary embodiment represented in the drawings, in which.

DESCRIPTION OF THE PREFERRED EMBODIMENTS

Figure 1:
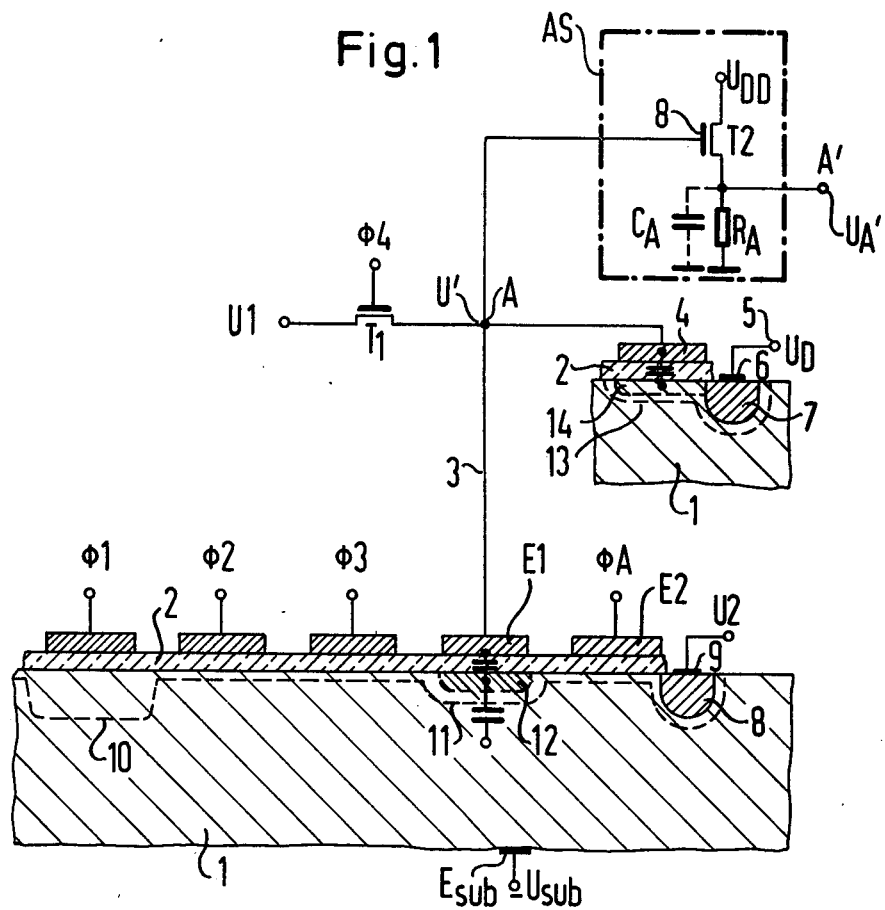
FIG. 1 is a fundamental illustration of an exemplary preferred embodiment in association with a three-phase CCD.

FIG. 1 schematically illustrates the output-end part of a three-phase CCD. This consists of a p-doped semiconductor layer 1, e.g., a silicon substrate, whose surface is coated with an electrically insulating layer 2 consisting, for example, of $SiO_2$. Above the latter are arranged a series of electrodes which are connected with pulse train voltages displaced in phase relative to one another. The three electrodes located furthest to the left which belong to a CCD element are referenced by time pulse train and phase symbols $\phi 1$, $\phi 2$, and $\phi 3$, and the pulse train voltages with which they are supplied are each provided with identical symbols in the time diagram in FIG. 3. It can be imagined that the illustrated part of the semiconductor layer 1 is extended towards the left and possesses a whole series of charge shift electrodes of this type. Those electrodes of all these shift elements which bear the same phase symbols, are then connected to a respective one of three pulse train voltage lines and are commonly pulsed.

Figure 3:
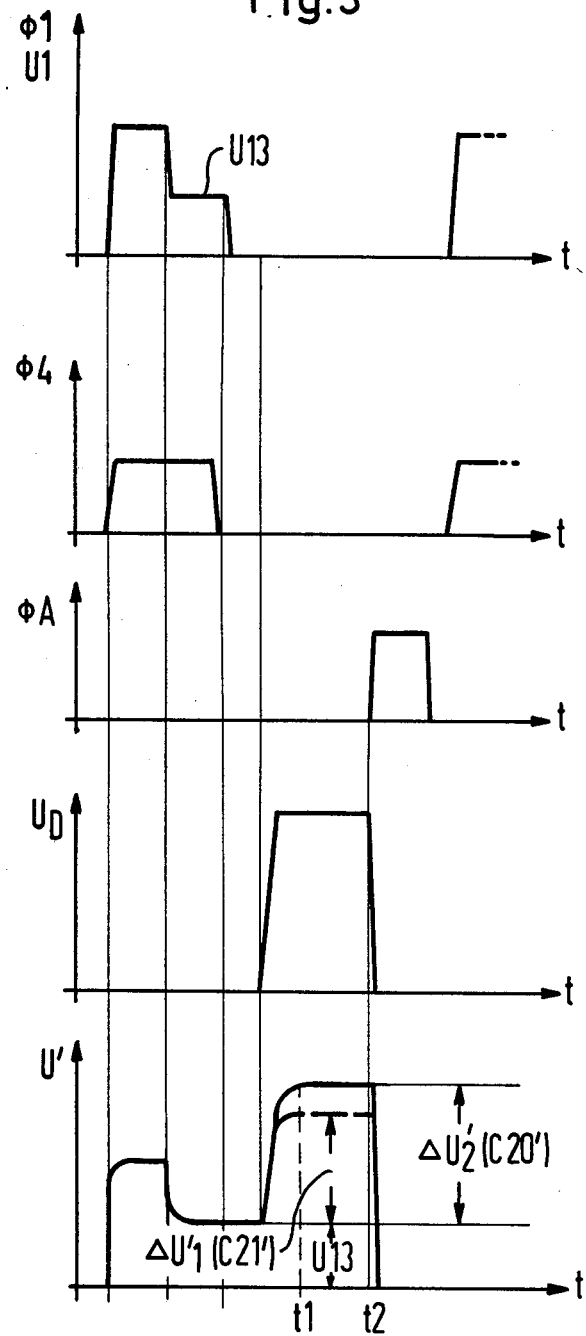
FIG. 3 shows voltage-time diagrams relating to FIG. 1.

A further electrode E1 is connected via a terminal A and via a line 3 to the source terminal of a field effect transistor T1 whose drain terminal is supplied with a pulse train voltage U1. The gate of T1 is connected to a pulse train voltage which is characterized by the time pulse train and phase symbol $\phi 4$ and in FIG. 3 is plotted over the time axis t. On the other hand, E1 is connected via A to the gate electrode 4, insulated from the semiconductor layer 1 by the insulating layer 2, of a MOS-capacitor whose other terminal 5 is conductively connected to an n-doped zone 7 via an electrode 6. Finally, E1 is also connected to an output stage AS which further processes the signal which has been transmitted via the CCD arrangement and can be tapped across the terminal A. For example, A is connected to the gate 8 of a read-out transistor T2 whose drain terminal is connected to a supply voltage $U_{DD}$, and whose source is connected to a circuit output A' and to earth via an impedance, either a resistor $R_A$ or a capacitance $C_A$. As a deviation from the above described construction, the output stage AS can also consist of other sub-circuits known per se or of the input stage of a further CCD arrangement.

The electrode E1 is followed by a further electrode which is referenced E2 and which is fed with a pulse train voltage bearing the phase symbol $\phi A$, and shown in its time dependence in FIG. 3. An n-doped zone 8 is connected to a d.c. voltage U2 via an electrode 9. The semiconductor layer also possesses an electrode $E_{sub}$, which is connected to a low, negative bias voltage $-U_{sub}$.

In operation, the occurrence of each individual positive voltage pulse of one of the pulse train voltages $\phi 1$, $\phi 2$, $\phi 3$, U1 and $\phi A$, beneath all the electrodes which are arranged to this pulse train voltage, results in the formation of so-called potential wells, i.e., local maxima of the potential on the surface of the semiconductor layer 1. In FIG. 1, for example, a broken line represents the course of the surface potential which corresponds to the time pulse train $\phi 1$, in the case of which the electrodes referenced $\phi 1$ are each fed with a voltage pulse. In this case, the indicated potential well 10 occurs. During the following time pulse train $\phi 2$, the potential well 10 is then displaced by one electrode spacing towards the right. The remaining potential wells are each located in a spacing of a multiple of three electrode spacings relative to the potential well 10. The displaced charges, which each consist of accumulations 12 of minority charge carriers of the semiconductor layer 1, are, in the illustrated exemplary embodiment, negative charges which are electrically introduced into the aforementioned potential wells or are accumulated therein and displaced in stepped fashion together with these wells. Here each of these charges refills the corresponding potential well to a specific extent resulting in a lower potential maximum than in the case of a well which does not contain a parcel of charge carriers.

The elecrtode E1 is intermittently connected to the voltage U1 in dependence upon the time pulse train $\phi 4$. First, beneath E1, there is formed a potential well 11 which, when it contains a charge, is partially filled. As, however, each $\phi 4$ pulse ends before the rear flank of the positive voltage pulse of U1 with which it somewhat coincides, the electrode E1, the line 3, the terminal A, the electrode 4 and the gate 8 remain or float at the potential which they reached under the influence of the pulse amplitude U13 at the time of the blockage of T1. The voltage of these circuit components relative to the semiconductor layer 1 which approximately carries earth thus corresponds to the value U13 (FIG. 3). The space charge zone occurring beneath the electrode 4 is referenced 13 in FIG. 1, whereas 14 represents an inversion layer which is formed from minority charge carriers of the semiconductor layer 1.

Figure 2:
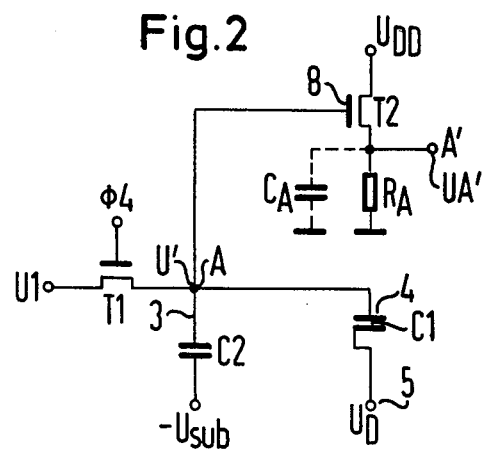
FIG. 2 is the equivalent circuit diagram of a part of the arrangement shown in FIG. 1.
Figure 4:
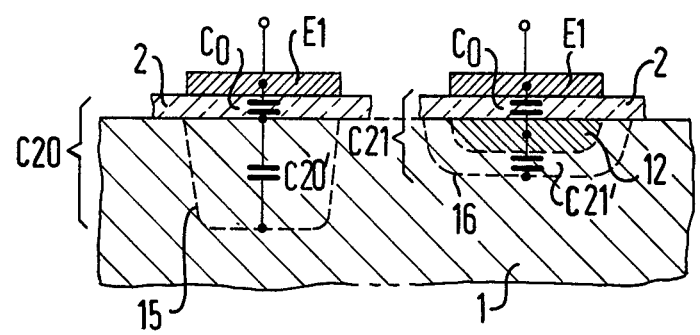
FIG. 4 shows further diagrams in explanation of FIG. 1.

In FIG. 2, C1 represents the capacitance of the MOS capacitor 4, 7, whereas C2 signifies the capacitance of the electrode E1 relative to the semiconductor layer 1 which carries the potential $-U_{sub}$. As can be seen from FIG. 4, in the absence of a parcel of charge carriers beneath E1 during the time pulse train $\phi 1$ and $\phi 4$, a space charge zone 15 is formed which produces a relatively low capacitance value C20' between the surface of the semiconductor layer 1 and the lower boundary surface of the space charge zone 15. If the series connected capacitance between the surface of the semiconductor layer 1 and the electrode E1 is referenced $C_o$, C2 obtains a value C20 which is fundamentally determined by the capacitance C20' which is considerably lower than $C_o$. If, on the other hand, a parcel of charge carriers 12 is present beneath E1, a less marked space charge zone 16 occurs (FIG. 4), which leads to an increase in the capacitance between the surface of 1 and the charge carrier parcel 12 and the lower boundary surface of 16 to a value C21'. However, this value is also considerably lower than $C_o$, so that C2 assumes a value C21 which is fundamentally determined by C21'. Here C21 is greater than C20.

Figure 5:
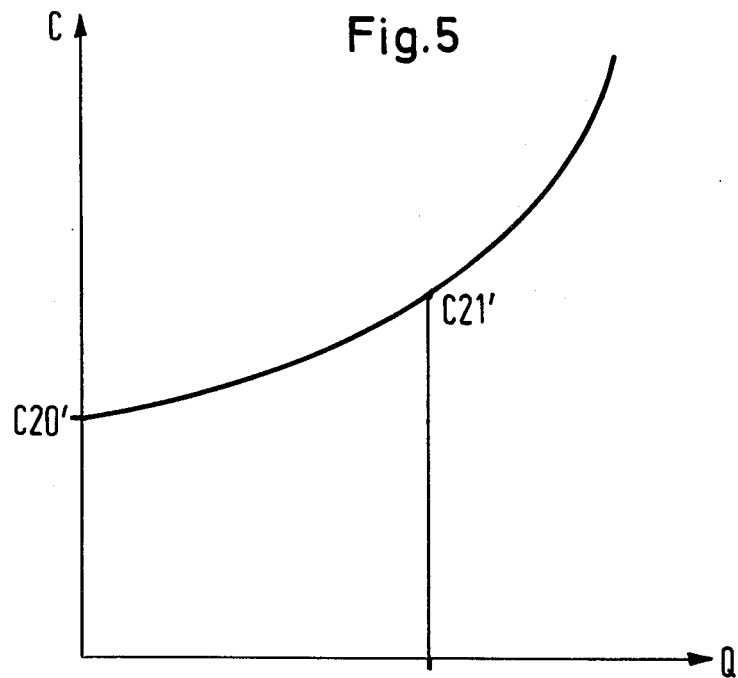
FIG. 5 illustrates the capacitances occurring across a shift electrode as shown in FIG. 1.

FIG. 5 illustrates the functional relationship of the capacitance C between the surface of the semiconductor layer 1 and the lower boundary surface of the space charge zones beneath the electrode E1 during the time pulse train $\phi 1$ and $\phi 4$ and the quantity of charge Q present beneath this electrode. Here the charge quantity zero corresponds to the capacitance value C20', whereas a charge quantity indicated by the shaded zone 12 in FIG. 4 corresponds to the capacitance value C21'.

At the time t1 (FIG. 3), a positive voltage pulse $U_D$ is connected to the terminal 5 of the MOS-capacitor 4, 7. Now an increase occurs in the voltage U' across the electrode 4 and across the gate 8 of t2 commencing from U13 by a value $\Delta U'$, where $$\Delta U' = U_D(C1/C2+C1). \qquad (1)$$

As regards the start voltage $U_T$ of the MOS-capacitor 4, 7 it is still necessary to adhere to the condition that $U'_{max} - U_{Dmax} \geq U_T$, where $U'_{max}$ is the maximum occurring value of U', and $U_{Dmax}$ is the maximum occurring value of $U_D$.

As $\Delta U'$ is, in accordance with equation (1), dependent upon C2 and, in accordance with the curve in FIG. 5, C2 is dependent upon the charge present beneath E1 and thus upon the instantaneous value of the input signal represented by this charge or, quite generally, upon the data to be analyzed, the increases in voltage U' are also information-dependent. FIG. 3 illustrates, for example, that on the occurrence of the capacitance value C20', an increase in voltage $\Delta U_2'$ occurs, whereas with C21' an increase $\Delta U_1'$ occurs. Consequently, across A or across the circuit output A', there occurs an output signal U', $U_A'$, which can be tapped within the time period t1, t2, and which possesses both an adequate amplitude and voltage fluctuations which are sufficiently amplified relative to the amplitude fluctuations in the input signal.

With an interference center concentration of $N = 2.5 \cdot 10 \text{ cm}^{-3}$, a thickness of the insulating layer 2 of 0.12 $\mu$m, a pulse train voltage amplitude of 8 V and a substrate bias voltage of $-3$ V, in a circuit example as described, there occurred a capacitance C2 of 0.044 fF/$\mu$m$^2$ electrode surface with an absence of charge beneath E1, on the other hand, with the occurrence of $8 \cdot 10^4$ charge carriers beneath E1 there occurred a capacitance C2 of 0.062 fF/$\mu$m$^2$. With an electrode area of 100 $\mu$m$^2$, a capacitance C1 of 6.5 fF, a voltage U13 of 8 V and a start voltage $U_T$ of 2 V, there occurred a voltage $U13 + \Delta U_1'$ (FIG. 3) of 14.3 V and a voltage $U13 + \Delta U_2'$ of 16.9 V, which corresponds to a voltage fluctuation of 2.6 V. Here the amplitude of the voltage $U_D$ amounted to at least 14.9 V.

In accordance with the equation (1), the amplification of the analysis circuit in accordance with the invention can be adjusted by changing the capacitance ratio C1/C2 being inversely proportional to the latter. The upper limit of the amplification is governed by the maximum possible voltage $U_D$.

When the relevant charge carrier parcel 12 has been analyzed in the described manner, as a result of the connection of a positive voltage pulse of the pulse train voltage $\phi A$ to the electrode E2, it is discharged in the time pulse train $\phi 2$ to the n-doped zone 8.

Figure 6:
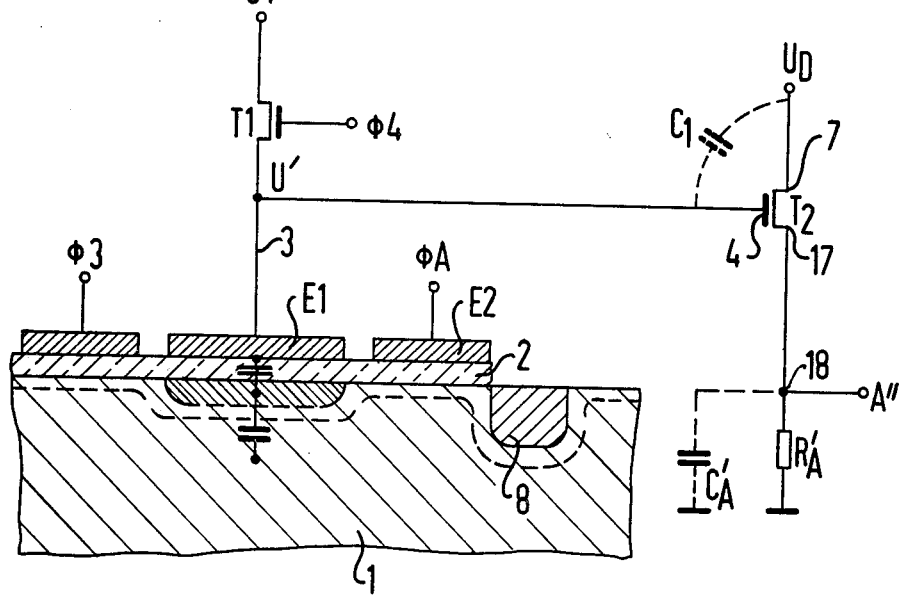
FIG. 6 illustrates a preferred further development of the exemplary embodiment corresponding to FIG. 1.

FIG. 6 shows the equivalent circuit diagram of a preferred further development of the analysis circuit shown in FIG. 1, in which the MOS-capacitor 4, 7 is designed as a MOS-field effect transistor. For this purpose, in the semiconductor layer 1, in addition to the n-doped zone 7, there is arranged a further, n-doped zone 17 which then, for example, represents a source zone and is connected via a terminal 18 to the circuit output A" and via an impedance $R_A'$ or a capacitance $C_A'$ to earth. The read-out transistor T2 illustrated in FIG. 1 here has been omitted, the function of which is assumed by the MOS-field effect transistor 4, 7, 17. In this case, the drain zone (7) is fed with a voltage $U_{DD}$ which can be a d.c. voltage or a pulse voltage.

It is particularly advantageous to produce the CCD arrangement, including the MOS-capacitor 4, 7 and possibly the additional read-out transistor T2 as a monolithically integrated MOS-circuit.

As a deviation from the previously described conductivity types of the individual circuit components, it is also possible to employ an n-doped semiconductor layer 1 in which p-doped zones 7 and 8 and possibly 17 are provided. In this case, the polarities of all the supply voltages must be reversed.

Furthermore, any one of the electrodes references $\phi 1$, $\phi 2$ or $\phi 3$ can be used as E1 electrode, in which case the time pulse train $\phi 4$ must conform with the time pulse train assigned to this electrode. Furthermore, the analysis circuit in accordance with the invention can also be applied in CCD arrangements which operate in accordance with a different pulse plan, thus, for example, in two-phase or four-phase operation.

It will be apparent to those skilled in the art that many modifications and variations may be effected without departing from the spirit and scope of the novel concepts of the present invention.

I claim as my invention:

1. A charge coupled device (CCD) having a semiconductor layer of a first conductivity type, a layer of insulating material on one surface of said semiconductor layer, a row of CCD shift electrodes on aid layer of insulating material, means for feeding pulse train voltages displaced in phase relative to one another to said CCD shift electrodes in a sequential manner, a first field effect transistor, a first terminal, a further shift electrode E1 on said insulating layer connected to said first terminal and through said first field effect transistor to a pulse train voltage source U1 which intermittently supplies one of said pulse train voltages to said further shift electrode and having a first amplitude during its initial stage and a second lower amplitude at its later stage, said semiconductor layer being connected to a reference potential, a field effect capacitor 4, 5 comprising a gate electrode 4 and a diffused zone located at the surface of said semiconductor layer, said field effect capacitor including said gate electrode 4 arranged on said layer of insulating material and a part of the surface of said semiconductor layer located beneath said gate electrode and adjacent to said diffused zone, means for supplying a periodic pulse square wave pulse ($U_D$) to said diffused zone which occurs after said pulse train voltage U1, and said terminal A of said further shift electrode E1 connected to the gate 4 of said field effect capacitor to serve as a signal output and an additional shift electrode and a periodic square wave pulse $\phi A$ which occurs after said periodic pulse $U_D$ supplied to said additional shift electrode.

2. A charge coupled device as claimed in claim 1, which includes an output stage connected to said first terminal.

3. A charge coupled device as claimed in claim 2, in which said output stage includes a second field effect transistor whose source terminal is connected via an impedance element to said reference potential and to a circuit output terminal, the gate of said second field effect transistor being connected to said first terminal.

4. A charge coupled device as claimed in claim 1, in which said CCD arrangement, including said field effect capacitor and said field effect transistor, are formed as part of a monolithic integrated MOS circuit.

5. A charge coupled device (CCD) having a semiconductor layer of a first conductivity type, a layer of insulating material on one surface of said semiconductor layer, a row of CCD shift electrodes on said layer of insulating material, means for feeding pulse train voltages displaced in phase relative to one another to said CCD shift electrode in a sequential manner, a first field effect transistor, a first terminal, a further shift electrode E1 on said insulating layer connected to said first terminal and through said first field effect transistor to a pulse train voltage source U1 which intermittently supplies one of said pulse train voltages to said further shift electrode and having a first amplitude during its initial stage and a second lower amplitude at its later stage, said semiconductor layer being connected to a reference potential, a second field effect transistor comprising a gate electrode 4 and a pair of diffused zones located at the surface of said semiconductor layer, said second field effect transistor including said gate electrode 4 arranged on said layer of insulating material and a part of the surface of said semiconductor layer and located between said pair of diffused zones means for supplying a periodic square wave pulse ($U_D$) to one of said pair of diffused zones which occurs after said pulse train voltage U1, and said terminal of said further shift electrode E1 connected to the gate 4 of said second field effect transistor, an additional shift electrode and a periodic square wave pulse $\phi A$ which occurs after said periodic pulse $U_D$ supplied to said additional shift electrode, an impedance connected between said other one of said pair of diffused zones and said reference potential and an output terminal connected to said other one of said pair of diffused zones.

* * * * *